(12) United States Patent
Balasubramaniam et al.

(10) Patent No.: US 8,957,803 B2
(45) Date of Patent: Feb. 17, 2015

(54) CAPACITIVE VOLTAGE DIVIDER

(75) Inventors: Harish Balasubramaniam, Darmstadt (DE); Harald Neubauer, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 383 days.

(21) Appl. No.: 13/463,132

(22) Filed: May 3, 2012

(65) Prior Publication Data

US 2012/0306676 A1 Dec. 6, 2012

Related U.S. Application Data

(63) Continuation of application No. PCT/EP2010/066759, filed on Nov. 3, 2010.

(30) Foreign Application Priority Data

Nov. 4, 2009 (DE) .................. 10 2009 051 830

(51) Int. Cl.
*H03M 1/12* (2006.01)
*H03M 1/06* (2006.01)
(Continued)

(52) U.S. Cl.
CPC .......... *H03M 1/0678* (2013.01); *H03M 1/0682* (2013.01); *H03M 1/46* (2013.01); *H03M 1/78* (2013.01)
USPC ............................. 341/172; 341/144; 341/155

(58) Field of Classification Search
CPC ... H03M 1/0678; H03M 1/0682; H03M 1/46; H03M 1/78
USPC ......................... 341/155, 172, 144
See application file for complete search history.

(56) References Cited

U.S. PATENT DOCUMENTS 4,097,753 A 6/1978 Cook et al.
4,399,426 A * 8/1983 Tan ............................. 341/120
(Continued)

FOREIGN PATENT DOCUMENTS

DE 2711829 C2 3/1977
JP S61-039726 2/1986
(Continued)

OTHER PUBLICATIONS

Anderson, T., Optimum Control Logic for Successive Approximation Analog-to-Digital Converters, JPL Technical Report 32-1524, vol. XIII.

(Continued)

*Primary Examiner* — Jean B Jeanglaude
(74) *Attorney, Agent, or Firm* — Michael A. Glenn; Perkins Coie LLP

(57) ABSTRACT

A capacitive voltage divider arrangement includes a first and second voltage divider and a first and second parasitic capacitance formed between the first and second capacitive voltage divider. The first capacitive voltage divider includes: a signal terminal; first capacitance for coupling the terminal to a reference potential; second capacitance; and third capacitance that is coupleable to the reference potential, the second capacitance being coupled in-between the terminal and third capacitance. The second capacitive voltage divider includes: a first compensation capacitance for coupling the terminal to the reference potential, the first compensation capacitance further being coupled to the terminal via the first parasitic capacitance; second compensation capacitance; and third compensation capacitance that is coupleable to the reference potential, the second compensation capacitance being coupled in-between the terminal and third compensation capacitance, and the second parasitic capacitance coupling the third capacitance to the third compensation capacitance.

12 Claims, 11 Drawing Sheets

(51) Int. Cl.
*H03M 1/46* (2006.01)
*H03M 1/78* (2006.01)

(56) References Cited

U.S. PATENT DOCUMENTS

| | | | |
|---|---|---|---|
| 4,661,802 A | | 4/1987 | Yukawa |
| 4,947,169 A | * | 8/1990 | Smith et al. ............ 341/121 |
| 5,272,481 A | * | 12/1993 | Sauer ..................... 341/165 |
| 5,548,203 A | * | 8/1996 | Kemerer et al. ......... 323/210 |
| 6,429,730 B2 | | 8/2002 | Houghton et al. |
| 6,583,416 B1 | * | 6/2003 | Villani ..................... 250/332 |
| 6,686,865 B2 | * | 2/2004 | Confalonieri et al. ... 341/172 |
| 7,515,080 B2 | | 4/2009 | Akizuki et al. |
| 7,609,184 B2 | | 10/2009 | Kuramochi et al. |
| 2002/0163457 A1 | | 11/2002 | Azami et al. |
| 2008/0246340 A1 | | 10/2008 | Swisher |

FOREIGN PATENT DOCUMENTS

| | | |
|---|---|---|
| JP | H11-195990 | 7/1999 |
| JP | 2009-118488 | 5/2009 |
| TW | 200534337 | 11/1988 |
| TW | 200416657 | 9/2004 |

OTHER PUBLICATIONS

Bonizzoni, et al., Third-Order Modulator with 61-dB SNR and 6-MHz Bandwodth Consuming 6 mW, IEEE Journal of Solid State Circuits, pp. 218-221, (2008).

Cong, et al., A new Charge Redistribution D/A and A/D Converter Technique—Pseudo C-2C Ladder, Aug. 2000, IEEE Journal of Solid State Circuits.

Gambini, et al., Low-Pwer Successive Approximation Converter With 0.5 V Supply in 90 nm CMOS, Nov. 2007, IEEE Journal of Solid State Circuits, pp. 2348-2357.

Hindman, et al., Experimentally Measured Input Referred Voltage Offsets and Kickback Noise in RHBD Analog Comparator Arrays, Dec. 2007, IEEE Transaction on Nuclear Science, pp. 2073-2079.

Jian, et al., A 59mW 10b 40Msample/s Pipelined ADC, 2005, Chinese Journal of Semiconductors, pp. 1301-1308.

Lee, et al., C-2C Digital-to-Analogue Converter on Insulator, Jul. 22, 1999, Electronics Letters vol. 35 No. 15.

Meinerzhagen, P., Design of a 12-bit Low Power SAR A/D Converter for a Neurochip, Master's Thesis UC Merced, 2008.

Singh, et al., C-2C Ladder-Based D/A Converters for PCM Codecs, Dec. 1987, IEEE Journal of Solid State Circuits, pp. 1197-1200.

Singh, et al., Design Methodologies in C-2C Ladder-based D/A Converters for PCM Codecs, IEE Proceedings G., vol. 135, No. 4, pp. 133-140, Aug. 1988.

Yuan et al., A 10-bit 5-MS/s Successive Approximation ADC Cell Used in a 70-MS/s ADC Array in 1.2 urn CMOS, IEEE Journal of Solid State Circuits, p. 866-872, Aug. 1994.

Cong, Lin, "Pseudo C-2C Ladder-based Data Converter Technique", Dept. of Electr. Eng., City Univ. of New York, NY, USA, Figure 1, Oct. 2001.

Woo, D.H. et al., "Current Input Extended Counting ADC With Wide Dynamic Rang for LWIR FPAS", Sensor Journal; IEEE; vol. 9; Issue 4; pp. 441-448 (Apr. 2009).

* cited by examiner

| Architecture (12 bits) | DNL (LSB) | INL (LSB) |
|---|---|---|
| C2C without shield | 80 | 40 |
| FVC C2C DAC | 4.25 | 3 |
| Hybrid DAC – (3 bit binary weighted capacitor array plus 9 bit FVS C2C array) | 0.5 | -1.25 |

FIGURE 2B

| | |
|---|---|
| Gain error (LSB) | 0.2 |
| Offset error (LSB) | 0.1 |
| Integral non-linearity (LSB) | ±1.8 |
| Differential non-linearity (LSB) | ±0.8 |
| Effective number of bits at 20 kHz | 10.6 |
| Signal-to-noise ratio at 20 kHz | 66.9 |
| Signal-to-noise and distortion ratio (dB) at 20 kHz | 65.2 |
| Maximum power consumption in $\mu W$ | 630 |

FIGURE 7

CAPACITIVE VOLTAGE DIVIDER

CROSS-REFERENCE TO RELATED APPLICATIONS

This application is a continuation of copending International Application No. PCT/EP2010/066759, filed Nov. 3, 2010, which is incorporated herein by reference in its entirety, and additionally claims priority from German Application No. DE 102009051830.4, filed Nov. 4, 2009, which is also incorporated herein by reference in its entirety.

BACKGROUND OF THE INVENTION

The present invention relates to a capacitive voltage divider as is used, for example, in analog-to-digital or digital-to-analog conversion of signals.

In conventional technology, capacitive digital-to-analog converters, in particular in connection with a comparator and a successive-approximation register, for forming an analog-to-digital converter are known. Such converters are applied, for example, in image sensors and are therefore generally suitable for low and medium resolutions as well as for being implemented on small surface areas.

Since said converters are implementable on small surface areas, parasitic capacitances constitute a problem for them. Due to the spatial vicinity of the structures, charge-carrying portions are close to one another, so that parasitic capacitances result. Digital-to-analog converters having capacitive voltage dividers, so-called capacitance-2-capacitance networks wherein capacitive elements from a series connection of a capacitance and the double capacitance thereof (also referred to as C2C=capacity-two-capacity) are used may be of interest for conversion, in particular, since they necessitate considerably fewer capacitances than comparable binary weighted capacitor arrays. For example, a 10-bit converter in a binary capacitance alignment necessitates about 1024 capacitances, whereas a C2C converter may make do with about 30 capacitances.

It is known that the linearity of C2C converters is substantially influenced by the parasitic capacitances of the capacitor array. In conventional technology, concepts such as predistortion, for example, are known for compensating for the parasitic capacitances. However, these methods have the disadvantage that they are highly dependent on exact knowledge of the parasitic capacitances. Thus, they are highly dependent on the implementation and cause higher production costs.

Efficient detection of analog signals necessitates integrating several low-noise, highly accurate analog and digital components. In various applications, such as for wireless sensor networks, CMOS image sensors (CMOS=complementary metal oxide semiconductor), biomedical implants, etc., data conversion places high demands on the performance and conversion behavior of the AD converters (AD=analog-to-digital) or DA converters (DA=digital-to-analog) used.

SAR ADCs (SAR=successive-approximation register, ADC=analog-to-digital converter) implemented in submicrometer technology are known, in conventional technology, for implementing analog-to-digital converters since they make do with reduced expenditure in terms of analog circuit technology, which is difficult and complicated to implement under conditions of low supply voltage. Binary weighted capacitive arrays are often used, in conventional technology, in successive-approximation ADCs. However, for each additional binary position, i.e. for each additional bit, the number of capacitances necessitated increases. The number of capacitances necessitated may increase exponentially with the number of binary positions to be converted. The maximally possible resolution of the ADCs is typically limited to about 8 to 10 bits, which is due to the high capacitance ratios and the low ratios between the available surface areas and the individual capacitances to be realized.

To avoid these problems, a C2C DAC may be used that is implementable on a comparatively small surface area, necessitates little power, and enables fast conversion as compared to binary DACs. What is disadvantageous about those C2Cs are the parasitic capacitances that arise at the inner connecting nodes and negatively influence the linearity of said C2C DACs. Because of the arising non-linearities, the resolution of C2C DACs is typically limited to 4 to 6 bits.

In conventional technology, various techniques are known which aim at reducing the parasitic effects, such as pseudo C2C ladders, cf. L. Cong and W. C. Black, "A New Charge Redistribution D/A and A/D Converter Technique-Pseudo C2C Ladder", in Proc. $43^{rd}$ IEEE Midwest Symposium on Circuits and Systems, August 2000, or fixed shield, cf. S. P. Singh, A. Prabhakar and A. B. Bhattcharyya, "C-2C Ladder Based D/A converters for PCM Codecs"; in IEEE Journal of Solid State Circuits, p. 1197-1200, December 1987, which, however, have not provided a satisfactory solution up to now. It is therefore problematic to implement C2C DACs necessitating a resolution of more than 6 bits.

A parasitic capacitance associated with a C2C ladder technology is illustrated in FIG. 8. FIG. 8 shows a C2C ladder structure wherein a first capacitance 801 is initially connected against a reference potential $U_0$. In parallel with the capacitance 801, the series connection has two further capacitances 802 and 803 located therein which are also connected against the reference potential $U_0$. In parallel with the capacitance 803, in turn, a further capacitance 804 is connected in series with a capacitance 805 against the reference potential $U_0$. In parallel with the capacitance 805, a capacitance 806 and a capacitance 807 are in turn connected in series against the reference potential $U_0$. In parallel with the capacitance 807, a capacitance 808 is in turn connected in series with a capacitance 809 against the reference potential $U_0$, a capacitance 810 being additionally connected in parallel with the capacitance 809 in FIG. 8. FIG. 8 shows a capacitive voltage divider wherein the capacitances referred to by reference numerals 802, 804, 806, and 808, respectively, result from a parallel connection of two capacitances C and consequently each have a capacitance of 2C. By contrast, the capacitances 801, 803, 805, 807, 809, and 810 are realized by the capacitance C in FIG. 8.

A capacitive voltage divider results. The voltage divider may be operated such that the analog voltage to be converted is applied against the reference potential $U_0$ at the capacitance 809. This results in a corresponding charge being stored within the capacitors 808, 809 and 810. It shall then be assumed in the following that this charge is stored within the respective capacitors and that no backflow of the charge is possible. By successively applying voltages to the nodal points 811, 812, 813, 814, or, alternatively, by applying corresponding reference potentials $U_0$, a bit combination may be determined wherein a specific voltage, such as 0V, $U_0$ or a minimum voltage, for example, results at the capacitor 809. In other words, in an iterative method, for example 5V are applied to the points 811, 812, 813, and 814, respectively. Depending on which point this voltage is applied to, this results in the voltage being divided along the capacitive voltage divider. The further this point is located away from the capacitor 809, the smaller the fraction of this voltage will be that ensures a charge transfer within the capacitors 808 and/or

809 and 810. If the correct bit combination is present—this may be detected, for example, by means of the smallest possible residual voltage at the capacitor 809—then the respective bit combination will have been found. Alternatively, the nodal points 811, 812, 813, and 814 may also be coupled to a reference potential, for example, and the terminals referred to by $U_0$ in FIG. 8 may be connected to the respective bit voltages.

FIG. 8 further shows parasitic capacitances having the value 2 Cp between the respective tapping points 811 to 814 and at the capacitors 809 and 810. In FIG. 8, the parasitic capacitances exist in relation to the substrate, which in the example contemplated also is to have the reference potential $U_0$. As may be seen from FIG. 8, the parasitic capacitances distort the linearity of the capacitive voltage divider. For example, the parasitic capacitances may represent a capacitance toward a bottom plate, a contacting or the like, a negligible capacitance of the upper limit of the semiconductor being assumed in this case. In principle, however, the parasitic capacitances may arise due to different layout variants within a semiconductor. The C2C DAC thus loses its linearity during the conversion process, since part of the charge is distributed across the parasitic capacitances during the conversion.

SUMMARY

An embodiment may have a capacitive voltage divider arrangement having a first voltage divider and a second voltage divider, a first parasitic capacitance and a second parasitic capacitance being formed between the first capacitive voltage divider and the second capacitive voltage divider, the first capacitive voltage divider having: a terminal for a signal; a first capacitance, via which the terminal may be coupled to a reference potential; a second capacitance; and a third capacitance that may be coupled to the reference potential, the second capacitance being coupled in between the terminal and the third capacitance; and the second capacitive voltage divider having: a first compensation capacitance, via which the terminal may be coupled to the reference potential, the first compensation capacitance further being coupled to the terminal via the first parasitic capacitance; a second compensation capacitance; and a third compensation capacitance that may be coupled to the reference potential, the second compensation capacitance being coupled in between the terminal and the third compensation capacitance, and the second parasitic capacitance coupling the third capacitance, at a terminal coupled to the second capacitance, to the third compensation capacitance, at a terminal coupled to the second compensation capacitance.

Another embodiment may have an analog-to-digital converter having an inventive capacitive voltage divider arrangement.

Another embodiment may have a digital-to-analog converter having an inventive analog-to-digital converter, further having a first switch matrix, a second switch matrix, an SAR control logic (SAR=successive-approximation register), a sample-and-hold element, and a comparator.

It is a core idea of the present invention to use a voltage shield (FVS, floating voltage shield) to reduce the parasitic capacitances within a C2C arrangement in relation to contactings or a base plate or ground plate. In this manner, the advantages of conventional C2C ladder technology may be maintained in embodiments. Embodiments may thus enable a C2C DAC having a resolution of more than 6 bits, for example having a resolution of 8 bits.

It is further a core idea of the present invention to use a successive-approximation ADC, which is based on C2C DAC architecture and is configured, e.g., in 0.18 μm CMOS 2-poly 4-metal technology, in a hybrid mode of operation. For example, a hybrid capacitive DAC may be used in order to unite the properties of a binary weighted capacitive array and a C2C array. For example, due to their low space requirements, the architectures based on C2C ladders may provide attractive implementations, which may be operated both fast and at a low power requirement, it being possible, due to the corresponding voltage shield, to achieve a higher level of linearity as compared to conventional concepts.

A further core idea of the present invention is utilization of the voltage shield (FVS) to reduce the effect of the parasitic capacitances and to enable more effective use of a C2C DAC. In embodiments, hybrid DACs with SAR may be used. For example, a two-stage preamplifier may be used, followed by a dynamic latch (one-bit storage), a switch matrix, or switch array, and digital circuitry for switching and control. In one embodiment, such an ADC may make do with a maximum power consumption of 630 μW at a conversion rate of about 2 MS/s and a voltage supply of 1.8 V at a clock rate of 40 MHz.

A further core idea of the present invention is to utilize, in the above-described implementation, extremely simple and robust analog architectures for comparators, for example, and to thus render the ADC more robust against manufacturing tolerances.

A further core idea of the present invention is to reduce the influence of parasitic capacitances in a C2C digital-to-analog converter by introducing additional C2C structures specifically for producing the voltage shields or potential shields. Therefore, embodiments of the present invention may reduce the change in a target capacitance value due to parasitic capacitances, and increase the linearity of C2C structures. This generally refers to capacitive voltage dividers. It is therefore a further core idea of the present invention to mount additional compensation capacitances within a capacitive voltage divider such that the influence of parasitic capacitances is reduced. Embodiments therefore improve the influence of parasitic capacitances on capacitances implemented in a targeted manner. In embodiments this may be exploited in a positive manner in particular with regard to digital-to-analog converters. Said DA converters may further be complemented with a comparator and a successive-approximation register to form an analog-to-digital converter.

A core idea of the present invention is to reduce the effect of a parasitic capacitance within a capacitive voltage divider by means of a shield that has an effect. In embodiments, an actual useful capacitance may be shielded by a second capacitor array that has an effect. Generally, in embodiments, shielding is feasible for all capacitor arrays, in principle, so that embodiments are not limited to DA and/or AD converters. Therefore, embodiments generally refer to capacitive voltage dividers. In embodiments, said shield may be achieved, in a semiconductor process, by underlying metal layers, for example. The actual useful capacitance may be implemented by a metal-metal capacitance, e.g., in the upper metal sheets of a substrate, it then being possible to realize the shield in the underlying metal layers. In other embodiments, it is also possible to achieve the shield by means of poly-poly capacitances. In variants of embodiments, this shield may serve to shield off parasitic capacitances within an analog-to-digital converter in accordance with the method of successive approximation.

Therefore, embodiments offer the advantage that such capacitances—in particular capacitor arrays having several capacitances—which have a considerably reduced influence of parasitic capacitances become implementable.

BRIEF DESCRIPTION OF THE DRAWINGS

Embodiments of the present invention will be detailed subsequently referring to the appended drawings, in which:

FIG. 2b shows a comparison of simulation results of various DAC architectures;

FIG. 7 shows a table comprising simulation results of an embodiment; and

DETAILED DESCRIPTION OF THE INVENTION

Embodiments will be explained below with reference to the accompanying figures.

Figure 1:
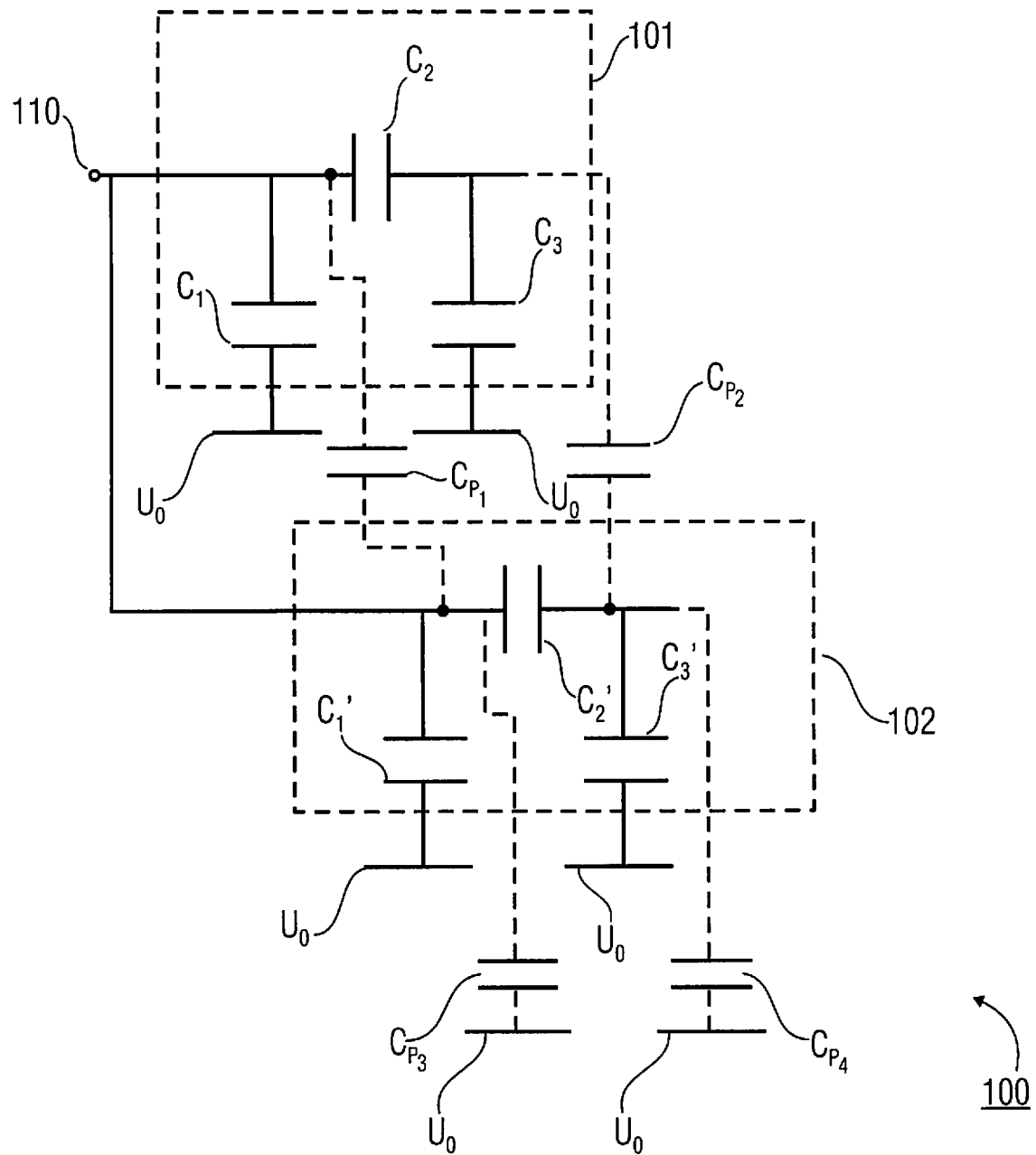
FIG. 1 shows an embodiment of a capacitive voltage divider.

FIG. 1 shows an embodiment of a capacitive voltage divider arrangement 100 comprising a first capacitive voltage divider 101 and a second capacitive voltage divider 102. In addition, a first parasitic capacitance $Cp_1$ and a second parasitic capacitance $Cp_2$ are formed between the first capacitive voltage divider 101 and the second capacitive voltage divider 102. The embodiment of the capacitive voltage divider arrangement 100 comprises a terminal 110 for a signal and a first capacitance $C_1$, via which the terminal 110 may be coupled to a reference potential $U_0$, the capacitive voltage divider arrangement 100 further comprising a second capacitance $C_2$ and a third capacitance $C_3$, which may be coupled to the reference potential $U_0$, the second capacitance $C_2$ being coupled between the terminal 110 and the third capacitance $C_3$, and the first capacitance $C_1$, the second capacitance $C_2$ and the third capacitance $C_3$ being associated with the first capacitive voltage divider 101.

The second capacitive voltage divider 102 comprises a first compensation capacitance $C'_1$, via which the terminal 110 may be coupled to the reference potential $U_0$, the first compensation capacitance $C'_1$ further being coupled to the terminal 110 via the first parasitic capacitance $Cp_1$. The second capacitive voltage divider 102 further comprises a second compensation capacitance $C'_2$ and a third compensation capacitance $C'_3$. The third compensation capacitance $C'_3$ may be coupled to the reference potential $U_0$, the second compensation capacitance $C'_2$ being coupled between the terminal 110 and the third compensation capacitance $C'_3$, and the second parasitic capacitance $Cp_2$ coupling the third capacitance $C_3$, at a terminal coupled to the second capacitance $C_2$, to the third compensation capacitance $C'_3$, at a terminal coupled to the second compensation capacitance $C'_2$.

By means of dashed lines, FIG. 1 shows how the parasitic capacitances $Cp_1$ and $Cp_2$ couple both capacitive voltage dividers 101 and 102.

FIG. 1 further shows a third parasitic capacitance $Cp_3$ and a fourth parasitic capacitance $Cp_4$, the third parasitic capacitance $Cp_3$ being couplable to the reference potential $U_0$ via the terminal 110, and the fourth parasitic capacitance $Cp_4$ being couplable to the reference potential $U_0$ via the third compensation capacitance $C'_3$ at the terminal coupled to the second compensation capacitance $C'_2$.

The reference potential may be variable; for example, in embodiments, the first capacitance $C_1$, the third capacitance $C_3$, the first compensation capacitance $C'_1$ and the third compensation capacitance $C'_3$ may be couplable to the reference potential $U_0$ at different points in time, it being possible for the reference potential $U_0$ to be dependent on the time, i.e. in embodiments it may be that $U_0=U_0(t)$, and, thus, the reference potential $U_0$ may adopt different values at different points in time.

In embodiments, the first capacitance $C_1$, the second capacitance $C_2$, the third capacitance $C_3$, the first parasitic capacitance $Cp_1$, the second parasitic capacitance $Cp_2$, the first compensation capacitance $C'_1$, the second compensation capacitance $C'_2$, and the third compensation capacitance $C'_3$ may be implemented on a substrate.

In further embodiments, the substrate may comprise a first layer wherein the first capacitance $C_1$, the second capacitance $C_2$, and the third capacitance $C_3$ are implemented. In one embodiment, the substrate may further comprise a second layer wherein the first compensation capacitance $C'_1$, the second compensation capacitance $C'_2$, and the third compensation capacitance $C'_3$ are implemented, the first parasitic capacitance $Cp_1$ and the second parasitic capacitance $Cp_2$ resulting between the first and second layers.

As was already described above, in embodiments, the capacitive voltage divider arrangement 100 may further comprise a third parasitic capacitance $Cp_3$, via which the terminal 110 may be coupled to the reference potential $U_0$, the capacitive voltage divider arrangement 100 further comprising a fourth parasitic capacitance $Cp_4$, via which the third compensation capacitance $C'_3$ at the terminal coupled to the second compensation capacitance $C'_2$ may be coupled to the reference potential $U_0$.

In one embodiment, the third parasitic capacitance $Cp_3$ and the fourth parasitic capacitance $Cp_4$ may differ by less than 10%, 1%, or 0.1% in terms of their capacitances.

In further embodiments, the first capacitance $C_1$ and the second capacitance $C_2$ may differ by less than 10%, 1%, or 0.1%.

The first compensation capacitance $C'_1$ and the second compensation capacitance $C'_2$ may also differ by less than 10%, 1%, or 0.1%.

In further embodiments, half of the second capacitance $C_2$ and the third capacitance $C_3$ may differ by less than 10%, 1%, or 0.1%. In addition, half of the third compensation capacitance $C'_3$ and the second compensation capacitance $C'_2$ may differ by less than 10%, 1%, or 0.1%.

In embodiments, the first parasitic capacitance $Cp_1$ and the second parasitic capacitance $Cp_1$ may differ by less than 10%, 1%, or 0.1%, and/or half of the third parasitic capacitance $Cp_3$ and the fourth parasitic capacitance $Cp_4$ may differ by less than 10%, 1%, or 0.1%.

Figure 2A:
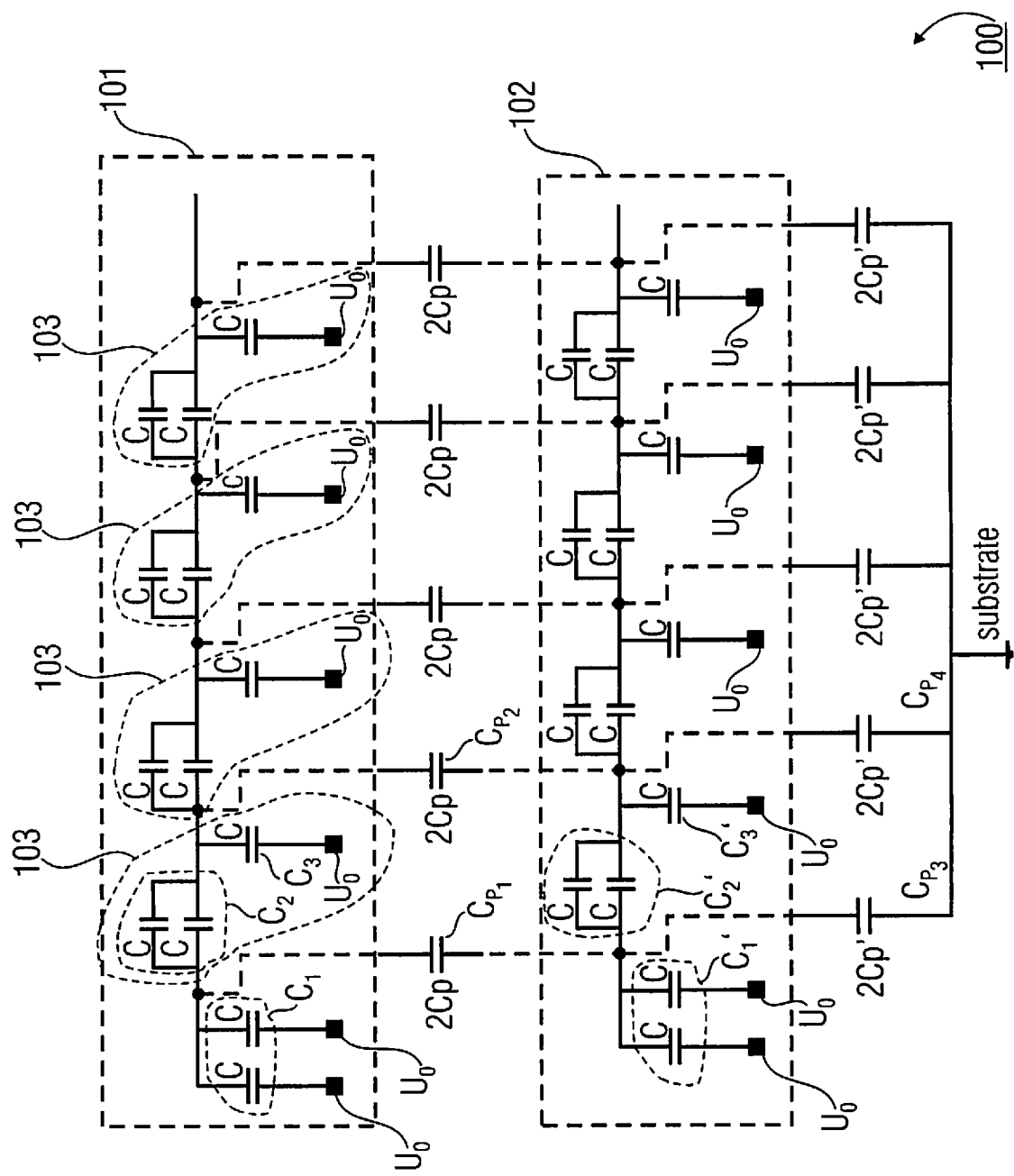
FIG. 2a shows a further embodiment of a capacitive voltage divider.

FIG. 2a shows a further embodiment of a capacitive voltage divider arrangement 100. In the embodiment of FIG. 2a, the direct capacitances within the voltage dividers 101 and/or 102 are formed with capacitors having the capacitance C. In addition, each of both voltage dividers 101 and 102 is formed of a multitude of capacitive elements 103. A capacitive element results from a series connection of the capacitance $C_2$ and the capacitance $C_3$. The next capacitive element in line, respectively, 103 is present between the two capacitances $C_2$ and $C_3$, as is shown by the voltage divider 101 in FIG. 2a. In embodiments, each of both capacitive voltage dividers 101 or 102 may consist of a multitude of such capacitive elements. In addition, in FIG. 2a, the capacitance $C_1$ is formed of the parallel connection of two capacitances C, as is the capacitance $C_2$. The third capacitance $C_3$ comprises only half of this capacitance—accordingly, the single capacitance C.

For reasons of clarity, reference numerals are fully indicated only for the first voltage divider 101 in the embodiment of FIG. 2a; the voltage divider 102 is analogous. In addition, it shall be noted that in FIG. 2a, all of the capacitances are indicated by the value C, which is not to be interpreted to mean that in embodiments, all of the capacitances need to be exactly identical. Rather, certain manufacturing tolerances between the capacitances occur, however FIG. 2a is to be understood to mean that, in this embodiment, any capacitances indicated, as depicted in FIG. 2a, may be around the value C within a tolerance range of ±10%, 1%, 0.1%. This need not necessarily apply to the parasitic capacitances; they may have values deviating from the capacitance C, such as Cp or Cp'.

In addition, the parasitic capacitances are indicated to have a value of 2 Cp in FIG. 2a, all of the parasitic capacitances between the first voltage divider 101 and the second voltage divider 102 being selected to be the same, which need not be the case in embodiments. What also applies to embodiments is that the parasitic capacitances need not be identical; for example, they may be around a value Cp within a tolerance range of ±10%, 1%, 0.1%. In addition, in the embodiment of FIG. 2a it shall be assumed that the first voltage divider 101 is implemented on a first layer on a substrate, and the second voltage divider 102 is implemented on a second layer located between the substrate and the first layer. Therefore, further parasitic capacitances, which are indicated to have a value of 2 Cp' in FIG. 2a, result between the second voltage divider 102 and the substrate itself. It shall be assumed in the embodiment, without being generally restricted thereto, that their capacitances Cp' also lie within a tolerance range of 10%, 1%, 0.1%.

Figure 8:
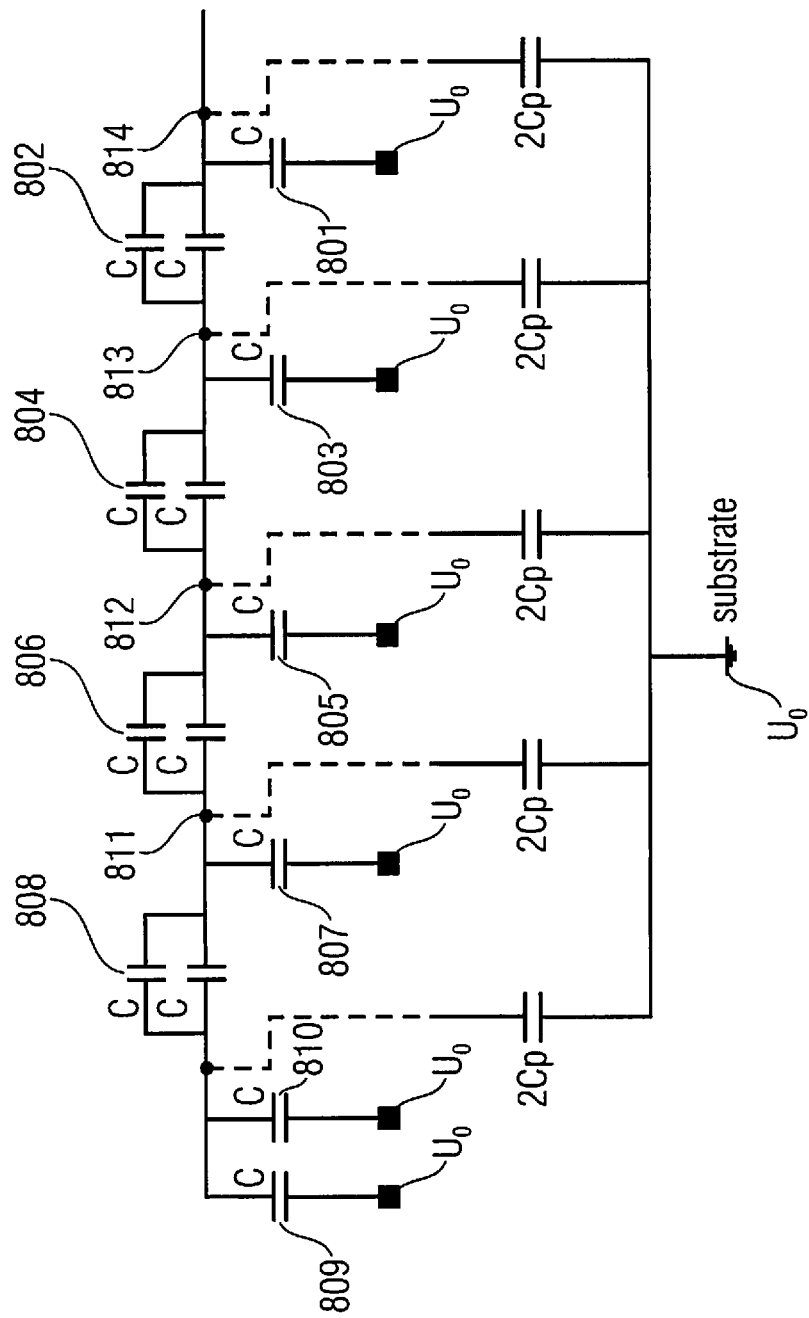
FIG. 8 shows a conventional C2C DAC.

FIG. 2a shows that the parasitic capacitances form, for example between the first voltage divider 101 and the second voltage divider 102, between the respective capacitive elements 103. By increasing the potentials at the same nodes within the second voltage divider 102, the influences of the parasitic capacitances between the first voltage divider 101 and the second voltage divider 102 may be reduced. The influence of the parasitic capacitances between the second voltage divider 102 and the substrate is to be considered, in principle, to be similar to the influence of the parasitic capacitances within a conventional voltage divider as is shown in FIG. 8. However, since for voltage division, the first voltage divider 101 is used, which, as compared to the second voltage divider 102, has parasitic capacitances with reduced influence, said first voltage divider 101 may be operated with improved linearity. In the following, embodiments of DA converters having structures in accordance with FIG. 2a may also be referred to as floating voltage shields C2C (FVS).

In embodiments, a base plate, contacts, generally a conducting surface, which in FIG. 2a represents the substrate, for example, may be shielded from the capacitances of the first voltage divider 101, namely by the voltages or potentials generated by the second capacitive voltage divider 102. The voltages formed at the nodes of the second capacitor array or of the second capacitive voltage divider 102 reduce the voltage drop across the parasitic capacitances between the first capacitive voltage divider 101 and the second capacitive voltage divider 102. Therefore, in embodiments, the linearity of the first voltage divider 101 may be improved even though the second capacitive voltage divider 102 may have linearity problems. In embodiments, the first voltage divider 101 may therefore be used for ADCs and/or DACs, it being possible for said ADCs and/or DACs to exhibit improved linearities and, thus, higher resolutions.

Operation of such an ADC and/or DAC may in principle be effected conventionally, with SAR, with slightly increased power consumption, caused by the second capacitive voltage divider. FIG. 2b illustrates a table comprising simulation results to demonstrate the effectiveness of embodiments of the present invention. FIG. 2b shows a comparison of different DAC architectures. This is based on the assumption of a resolution of 12 bits. Three different capacitive voltage dividers or capacitor arrays were simulated, and their INLs (integrative non-linearities) and DNLs (differentiated non-linearities) were evaluated. To this end, an 0.18 μm 4-metal 2-polystructure was used for creating the three different capacitor arrays. In the first line, FIG. 2b shows the simulation results for a C2C structure without any shield, in the second line it shows the results for an FVS C2C DAC structure in accordance with FIG. 2a, and in the third line it shows simulation results for a hybrid structure, wherein the first three bits are formed by a binary weighted capacitor array, whereupon nine further bits are formed by a structure in accordance with FIG. 2a. The simulation results of FIG. 2b show that the structure of FIG. 2a may enable an improvement by a factor of more than 10 over the conventional structure as is depicted in FIG. 8. The hybrid structure of the DAC, wherein the three bits are determined using a weighted capacitor array, and nine bits with a C2C array in accordance with FIG. 2a, enables reducing the differential non-linearity to below 1 LSB (least significant bit).

Embodiments of the present invention have the advantage that they are easy to implement, since only the second capacitor array, which will also be referred to below as the compensation capacitor array, needs to be implemented, along with possibly necessitated switches for creating the voltage shield and/or for switching corresponding voltages to the nodes of the second voltage divider 102. For example, if a method in 0.13 μm technology comprising eight metal options is used, the voltage shielding concept may allow, in embodiments, an increase in the resolution of a C2C DAC to more than eight bits, for example. The linearity of such a structure further depends on the settling time of the DACs themselves, so that in embodiments, in a process with successive approximation of a register for AD conversion, the corresponding settling phases may be taken into account; in other words, the AD converter realized in such a process cannot make a reliable decision until the DAC has reached a stable condition.

Figure 3:
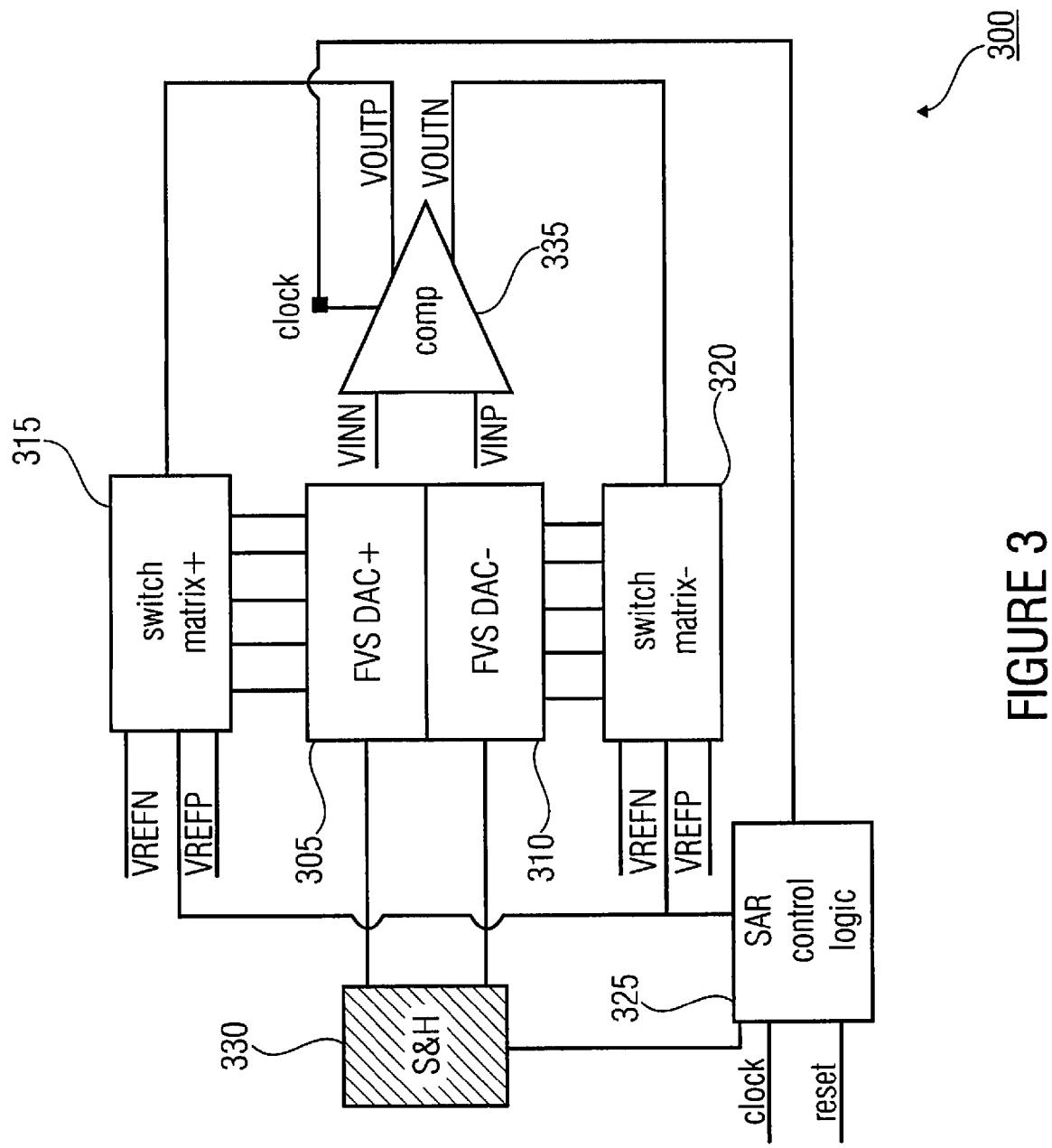
FIG. 3 shows an SAR ADC architecture comprising an embodiment of a capacitive voltage divider.

Embodiments further comprise a DA converter which comprises one of the above-mentioned capacitive voltage divider arrangements 100. In embodiments, the DAC converter may be based on SAR, i.e. on the successive approximation of a register. FIG. 3 shows an embodiment of an analog-to-digital converter ((ADC) 300 comprising a capacitive voltage converter arrangement 100. FIG. 3 shows an SAR ADC architecture. The AD converter 300 comprises two FVS capacitor arrays 305 and 310, which may correspond to a capacitive voltage divider arrangement 100. FIG. 3a further shows two switch networks 315 and 320, which here are configured as switch matrices 315 and 320. Moreover, the ADC 300 comprises an SAR control logic 325 and a sample-and-hold element 330 (holding element). In addition, the ADC comprises a differential amplifier 335, which may have a high resolution.

Simulation of the embodiment 300 will be explained in more detail below. During the behavior simulation of the embodiment 300, all of the analog components were assumed to be ideal; a four-bit weighted capacitor array having the capacitances 2C, 4C, 8C, 16C, and an eight-bit FVS C2C array were assumed for the hybrid DAC variant. The entire number of capacitances within the fully differential FCS DAC, shown in FIG. 3, is 212, i.e. 106 capacitances for the FVS DAC+ 305, and 106 capacitances for the FVS DAC− 310. It shall be noted that in the embodiment 300 both FVS DACs 305 and 310 are configured for differential conversion. The SAR ADC is therefore suited to convert fully differential input signals within a common-mode range of 900 mV.

In embodiments, the capacitive voltage divider arrangement 100 may also be employed individually, i.e. embodiments are not limited to differential implementations. In other words, embodiments may also be configured as a so-called "single-ended" implementation, or may also be configured to be unsymmetrical, i.e. said embodiments relate to a single input signal having a reference potential such as zero or ground, for example.

Both switch matrices 315 and 320 switch reference voltages to the nodal points of the two capacitive voltage dividers 305 and 310. Said nodal points are represented, in the embodiment 100 of FIG. 2a, between the individual capacitive elements 103 of the capacitive voltage divider 101. The SAR ADC of the embodiment 300 in FIG. 3a detects the data or outputs of the comparator 335 during each clock cycle, and controls the hybrid FVS DAC bit by bit while employing a binary search algorithm. After n clock cycles, the digital output value has been achieved, i.e. that bit combination which best reproduces the differential analog voltage to be converted has been found. At the beginning of each conversion, additional m clock cycles are necessitated to store the output signal of the comparator at the input of both capacitive voltage divider arrangements 305 and 310, and to subsequently reset the comparator.

In the embodiment 300, the AD conversion is controlled by a reset pulse that may be applied to the SAR control logic 325 and initializes the conversion process. The conversion may be subdivided into two phases. During the first phase, the comparator 335 is initially reset, and subsequently its output signal, which is differential, is stored, or sampled, onto the two voltage divider arrangements 305 and 310. For this phase, e.g. five clock cycles are used so as to provide the capacitive voltage divider arrangements 305 and 310 with sufficient time to store the input signal and to simultaneously reduce the settling time and the power requirements of the sample-and-hold element 330. Thus, m=5 will be assumed in the following. In other words, the differential analog voltage value to be converted is stored, at the end of the first phase, within the capacitive voltage divider arrangements 305 and 310, and also within the sample-and-hold element 330. For example, the respective analog value, cf. FIGS. 1 and 2a, may be stored, via corresponding charges, within the first capacitance $C_1$ and the second capacitance $C_2$ and/or within the compensation capacitances $C'_2$ and $C'_3$.

During the first phase, which is also referred to as the main bit-finding phase, the actual SAR algorithm takes place; in the present embodiment, n=13 clock cycles is assumed. Each of the bit cycles starts with a so-called overdrive recovery, cf. J. Yuan and C. Svenson, "A 10-bit 5-MS/s Successive Approximation ADC Cell Used in a 70-MS/s ADC Array in 1.2-μm CMOS", in IEEE Journal of Solid State Circuits, p. 866-872, August 1994, so as to bring a preamplifier output of the comparator 335 to a common-mode gain level as fast as possible before the actual preamplification starts. This may be effected, for example, by short-circuiting the outputs of the preamplifier without changing the voltage stored within the capacitive voltage divider arrangements 305 and/or 310. During this second phase, the terminals, i.e., e.g., also the substrate, of the voltage divider arrangement are switched back and forth between the reference potential, e.g. zero/ground, and the common-mode voltage, depending on the SAR output. After twelve clock cycles, all of the bits have been determined, and an indicator may indicate the end of the conversion (end of conversion flag), which may be followed by a bit transfer.

In the following, the components of the embodiment of the AD converter 300 of FIG. 3 will be explained in detail. In this embodiment, the components were selected with the aim of achieving as high a level of accuracy as possible, a high conversion rate and a low noise level or behavior. These components are depicted in detail in FIGS. 4a, 4b, and 4c. The most important components are the fully differential comparator 335, the SAR control logic and the switch matrix as well as the switch that serves to store the voltage to be converted.

Figure 4A:
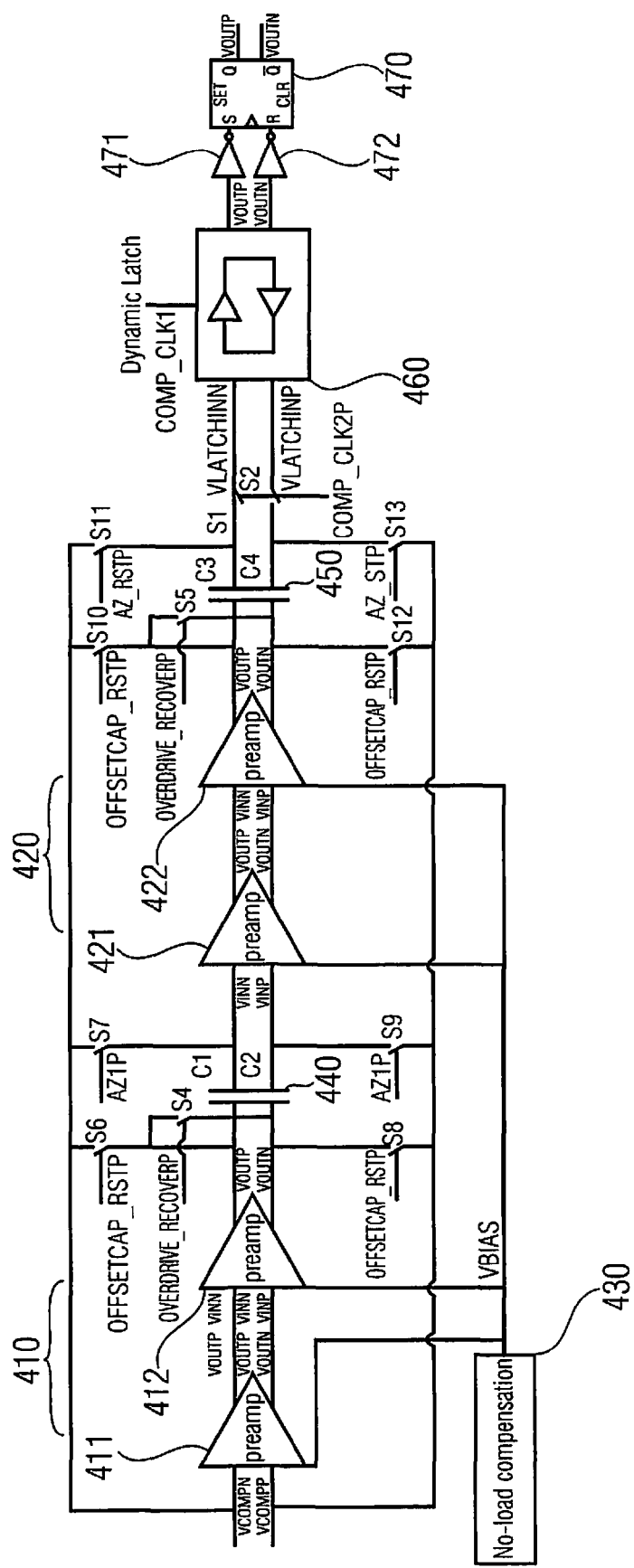
FIG. 4a shows a comparator architecture of an embodiment.

FIG. 4a shows an embodiment of a design of a comparator 335. The comparator comprises a first preamplification stage 410 and a second preamplification stage 420. Each of both preamplification stages 410 comprises two preamplifiers, the preamplifier stage 410 comprises two preamplifiers 411 and 412 connected in series, the second preamplifier stage 420 comprises two preamplifier stages 421 and 422 connected in series. Each of the four preamplifiers 411, 412, 421, and 422 enables no-load compensation that is connected to the no-load compensation block 430 and with the aid of which potential no-load voltages at the outputs of the preamplifiers may be compensated for. Both preamplifier stages 410 and 420 are separated by a capacitor 440. The output of the first preamplifier stage 410 further has the switches S4, S6, S7, S8, and S9 located thereat which serve to initialize, to reset, and to regenerate the amplifier following overloading.

The output of the second preamplifier stage 420 is connected to a memory, a so-called dynamic latch, via a capacitor 450. Initially, the output of the second preamplifier stage 420 has the capacitor 450 located thereat, which may be connected to the memory 460 via switches S1 and S2. In addition, the outputs of the second preamplifier 422 of the second preamplifier stage 420 have the switches S5, S10, S11, S12, and S13 located thereat, which also serve for initialization, regeneration and/or resetting. By means of the switches S1 and S2, the outputs of the second preamplifier stage 420 may be connected to the memory 460. The outputs of the memory, in turn, may then be stored in a flip-flop 470, presently designed as an RS flip-flop (RS=reset/set). The inputs of the flip-flop are presently connected via two inverters 471 and 472.

In an embodiment of FIG. 4a, the comparator may be able to detect voltages having small values, e.g. up to 200 μV, at a supply voltage of 1.8 V. For this reason, a simple latch, such as for the memory 460, for example, might not be useful, so that, in this embodiment, a multi-stage comparator, followed by a dynamic latch, are used for said low voltages. In accordance with FIG. 4a, either preamplifier stage 410 and 420 has two amplifiers 411 and 412, and 421 and 422, respectively, which achieve, overall, high common-mode gain, e.g. with a gain factor of more than 100. In order to compensate for offsets at the outputs, conventional compensation techniques may be employed.

Figure 4B:
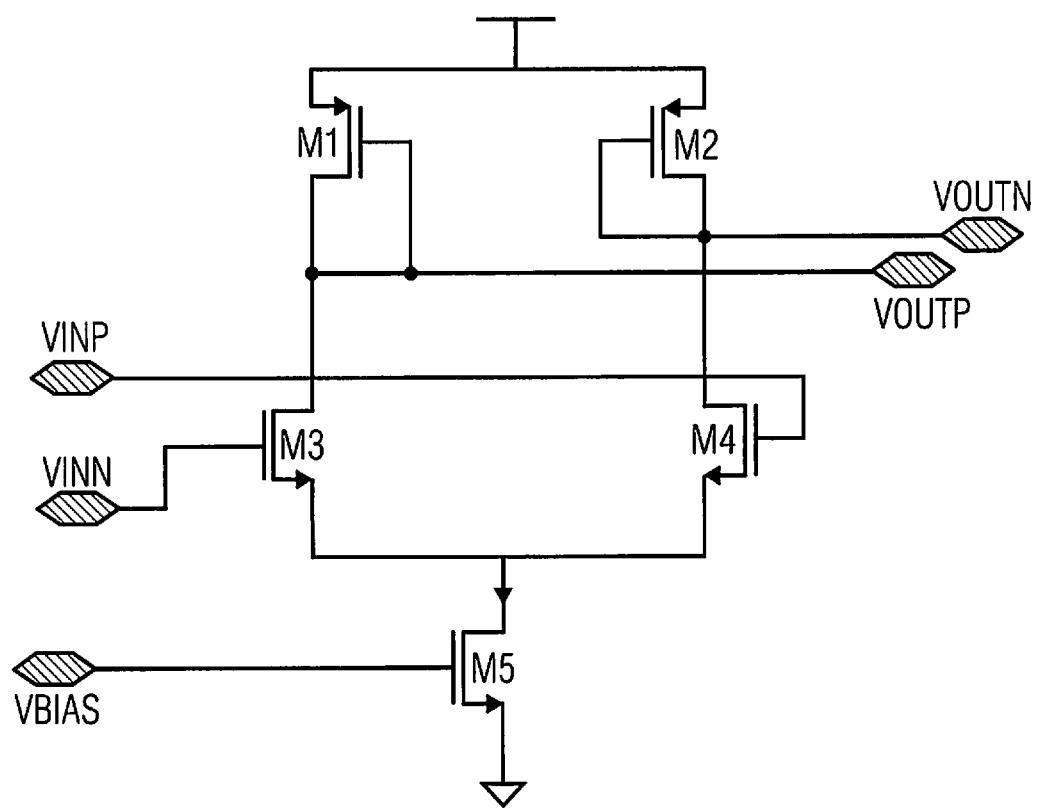
FIG. 4b shows a preamplifier circuit of an embodiment.

FIG. 4b shows an embodiment of one of the preamplifiers 411, 412, 421, or 422. FIG. 4b shows a structure having five transistors M1, M2, M3, M4, and M5. The embodiment in FIG. 4b comprises two parallel p-channel MOSFETs (metal oxide layer field-effect transistors) M1 and M2, as well as two n-channel MOSFET transistors M3 and M4 connected in series therewith, respectively, as well as a further n-channel MOSFET M5 for offset compensation. The transistor M3 is connected downstream from the transistor M1, the transistor M4 is connected downstream from the transistor M2. Both drain terminals of the transistors M3 and M4 are connected to the source terminal of the transistor M5. Both transistors M1 and M2 are configured as diode circuits (coupling between drain and gate terminals), both diodes thus formed being loaded by a differential stage, which is realized by the two transistors M3 and M4, and by a current source M5.

The embodiment of the preamplifier thus exhibits a robust architecture, with a differential pair of p-channel MOSFETs M1 and M2 which have corresponding p-MOS loads connected downstream therefrom. The outputs of the preamplifier VOUTN and VOUTP are connected to the gate and drain terminals of the transistors M1 and M2, respectively. Both inputs VINP and VINN are connected to both gates of the downstream n-channel MOSFETs M3 and M4, which load the outputs of the transistors M1 and M2 accordingly. The outputs of the transistors M3 and M4 have the MOSFET M5 connected downstream therefrom, the gate of which represents the compensation input, and which thus allows potential shifts of the entire structure, or renders the preamplifier compensatable. The preamplifier of the embodiment of FIG. 4b has a stable gain of about 3.5 for frequencies of up to 70 MHz, the preamplifier consuming moderate levels of power.

Figure 4C:
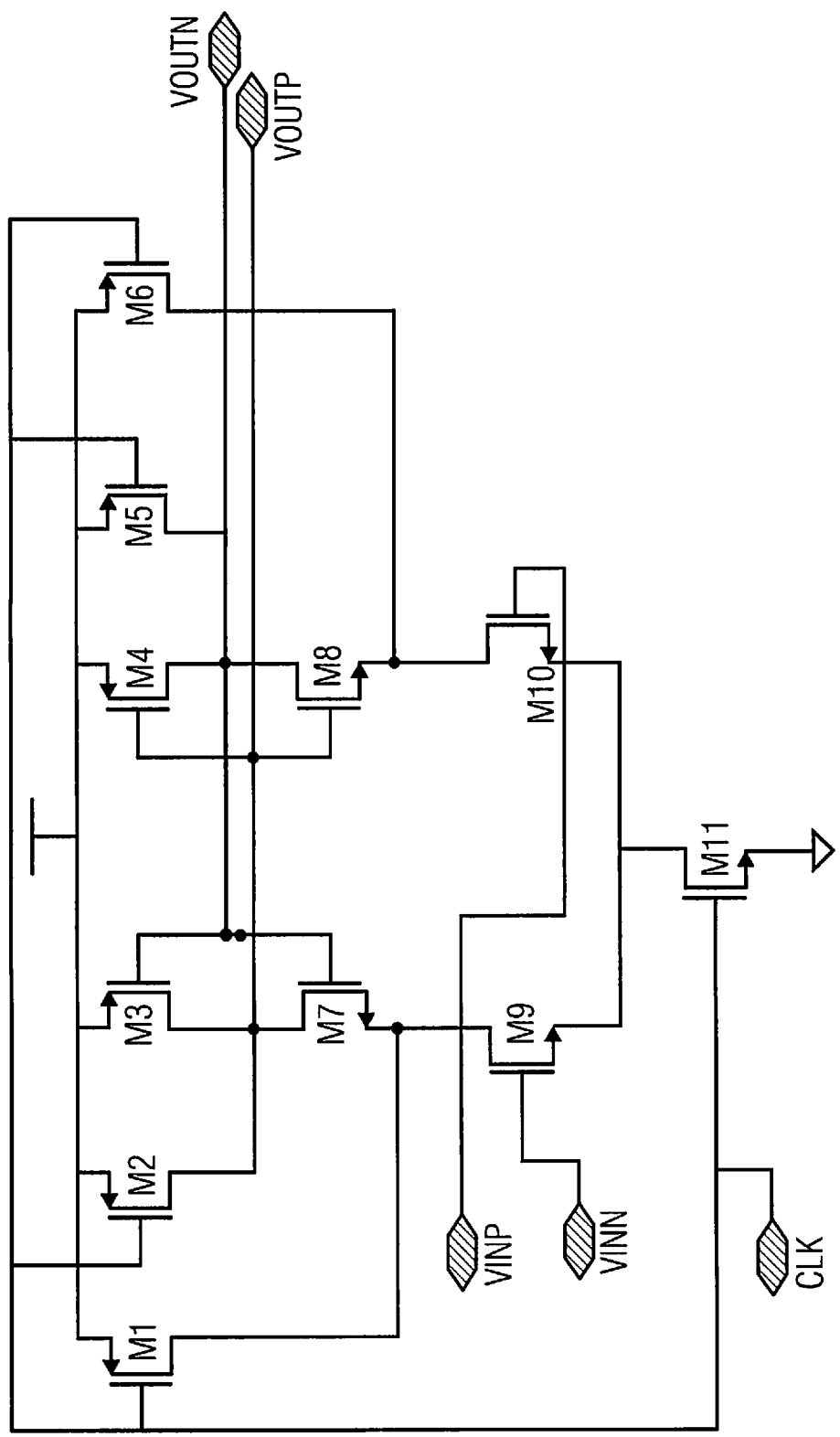
FIG. 4c shows a dynamic one-bit memory of an embodiment.

FIG. 4c shows an embodiment of a memory, i.e. the dynamic latch as is shown as the memory 460 in FIG. 4a. Said memories are known in literature, cf. F. Maloberti, E: Bonizzoni and A. Perez, "Third Order ΣΔ Modulator with 61 dB SNR and 6 MHz Bandwidth Consuming 6 mW", in IEEE Solid State Circuits Conference, p. 218-221, September 2008; L. Clark, D. Allee, N. Hindman and Z. Wang, "Experimentally Measured Input Refereed Voltage Offsets and Kickback Noise in RHBC Analog Comparator Arrays", in IEEE Transaction on Nuclear Science, p. 2073-2079, December 2007; C. J. Zhang, J. G. Yawei, S. Bo., L. Jian and Y. Jiefang, "A 59 mW 10b 40 M samples/s Pipelined ADC", in Chinese Journal of Semiconductors, p. 1301-1308, 2005.

The structure shown in FIG. 4c is known for its low offset of less than 5 mV and a low power consumption. The amplified differential output of the preamplifier may be transformed into a full-range voltage by the latch, as is illustrated, for example, in FIG. 4c. For example, the outputs VOUTN and VOUTP of the latch, as is shown in FIG. 4, may be kept at the supply voltage by a clock signal level that is kept on "low". The structure shown in FIG. 4c comprises six p-channel MOSFETs, also referred to as M1 to M6. In addition, the structure shows 5 n-channel FETs, also referred to as M7 to M10. Details about said structures may be gathered from the above-mentioned references.

For a clock frequency of 40 MHz—this corresponds to clock durations of 25 ns—about 18 ns remain for the preamplifier of the comparator to amplify the differential signal. The remaining time may be used by the dynamic latch, or by overload regeneration phases. Overall power consumption of the comparator may be assumed to be 190 µW, for example.

With reference to FIG. 3, the SAR control logic 325 implements the successive-approximation algorithm by successively setting and/or resetting the nodes of the capacitive voltage divider arrangement, cf. FIG. 1, nodes between $C_1$ and $C_2$ and/or $C'_1$ and $C'_2$, or, FIG. 2a, nodes between the capacitive elements 103. This may be effected, for example, starting with the most significant bit (MSB) and ending with the least significant bit (LSB), or vice versa. The respective states, e.g. that of the LSB, may be controlled, or checked, by the comparator 335. In conventional technology, SAR control logic circuits are known, cf. T. O. Anderson, "Optimum Control Logic for Successive Approximation Analog to Digital Converters, http://www.tmo.jpl.nasa.goc-/progress report2/XIII/XIIIW.PDF. For example, such an SAR control logic may be composed of two series connections of flip-flops forming a sequencer and a code register. Additional flip-flops may be added to the sequencer to generate control signals, such as for the reset phase or the sampling phase for the input signal of the ADC, for example.

The reference voltages utilized during the bit-finding phase may be between 0 V or a reference potential and 900 mV, for example. For this reason, in embodiments, switch arrays may be used that consist of N-MOS switches which are adapted in accordance with the magnitudes of capacitance within the capacitive voltage divider arrangement. Utilization of N-MOS switches and/or transistors enables fast switching behavior during the bit-finding phase, and enables switching operations with reduced charge injection, for example by using compensation switches (dummy switches).

Storage or sampling of the input signal and setting the reference voltages at the nodes of the capacitive voltage divider arrangement may be realized by fast sampling switches, for example. Within the context of examining embodiments, so-called bootstrapped switches, which due to their uniform charge injections may also be employed, were also examined. However, said switches are limited in their fields of application by an increased power requirement, which is due to the charging and discharging of their capacitances. Utilization of a large number of such switches would lead to increased power requirement, which has already been increased by introducing the second voltage divider within the voltage divider arrangement for shielding. This is why a so-called boosted-sampling switch has been implemented in the present example. Such a switch is of simple design, cf. S. Gambini and J. Rabaey, "Low Power Successive Approximation Converter with 0.5 V Supply in 90 nm CMOS", in IEEE Journal of Solid State Circuits, p. 2348-2357, November 2007; P. Meinerzhagen, "Design of 12 bit Low Power SAR A/D Converter for a Neurochip", Master Thesis, EPFL and UC Merced, 2008, as is shown in FIG. 5.

Figure 5:
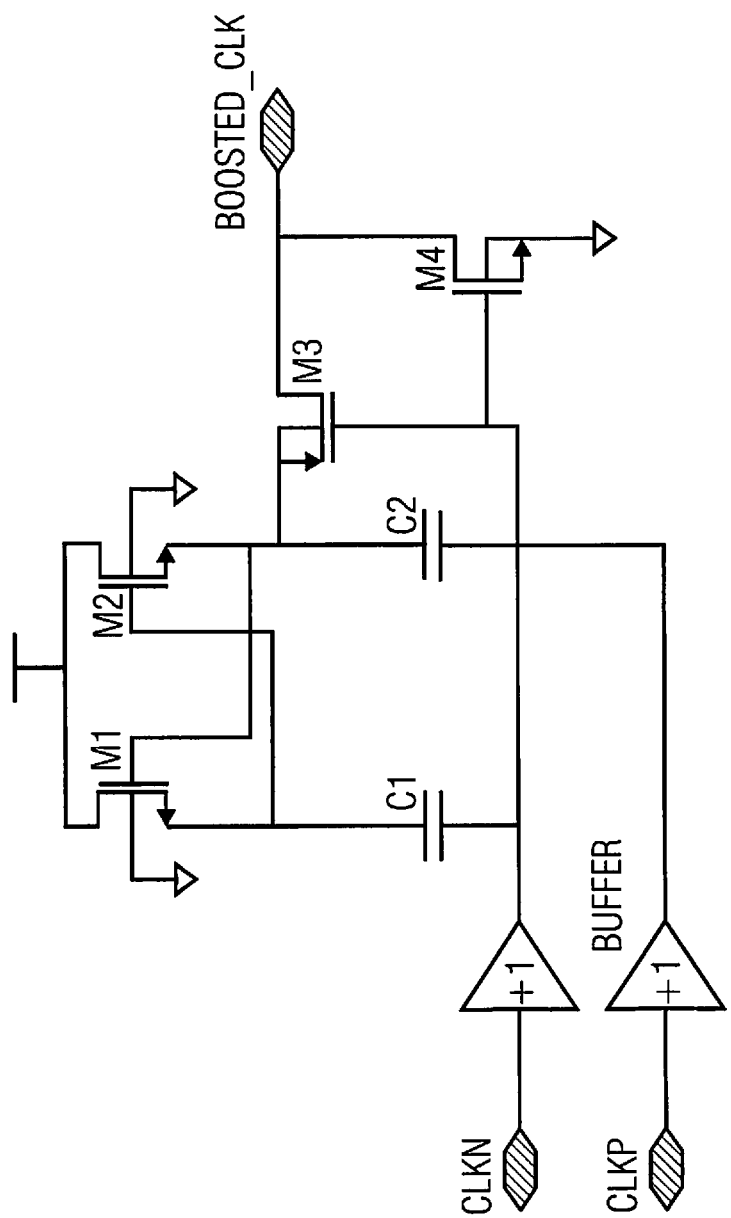
FIG. 5 shows a clock amplifier of an embodiment.

The structure shown in FIG. 5 amplifies and/or stabilizes the gate signal for a plurality of sampling switches. Amplification and/or stabilization of the gate signal provides a uniform voltage that may be just below the double supply voltage, for example. Amplification of the gate voltage is almost constant at different loads, which results in an almost equal charge injection over a voltage range of 0 to 1.8 V, for example. By providing an additional switch (compensation switch, or dummy switch), the charging effects may be further reduced, the fully differential DAC, cf. FIG. 3, already partly reducing charge injection effects. To avoid instabilities in the sampling switches in embodiments, 3.3 V thick oxide NMOS structures may be used, for example.

A similar design may be used for the switches of the switch matrix. Since the voltages of the nodes within the voltage divider arrangement cannot exceed the supply voltage during the bit-finding phase, problems that result, for example, from switching operations of the switch matrix during the bit-finding phase may be avoided in embodiments.

In the following, simulation results will be presented. Static simulations were performed, wherein a slowly rising high-resolution ramp voltage was applied to the input of the ADC. The clock frequency was selected to be 40 MHz, which corresponds to a conversion rate of about 2.2 MS/s. The voltage divider arrangement may be implemented in metal-insulator-metal technology (MIMCAPS) or with capacitances (POLYCAPS). In the following embodiment, the capacitive voltage divider FVS hybrid DAC was implemented in MIMCAP, the same capacitance value C having been used for the first and second voltage dividers. In this embodiment, the respective architecture of the voltage divider arrangement may be implemented using standard processes.

Figure 6:
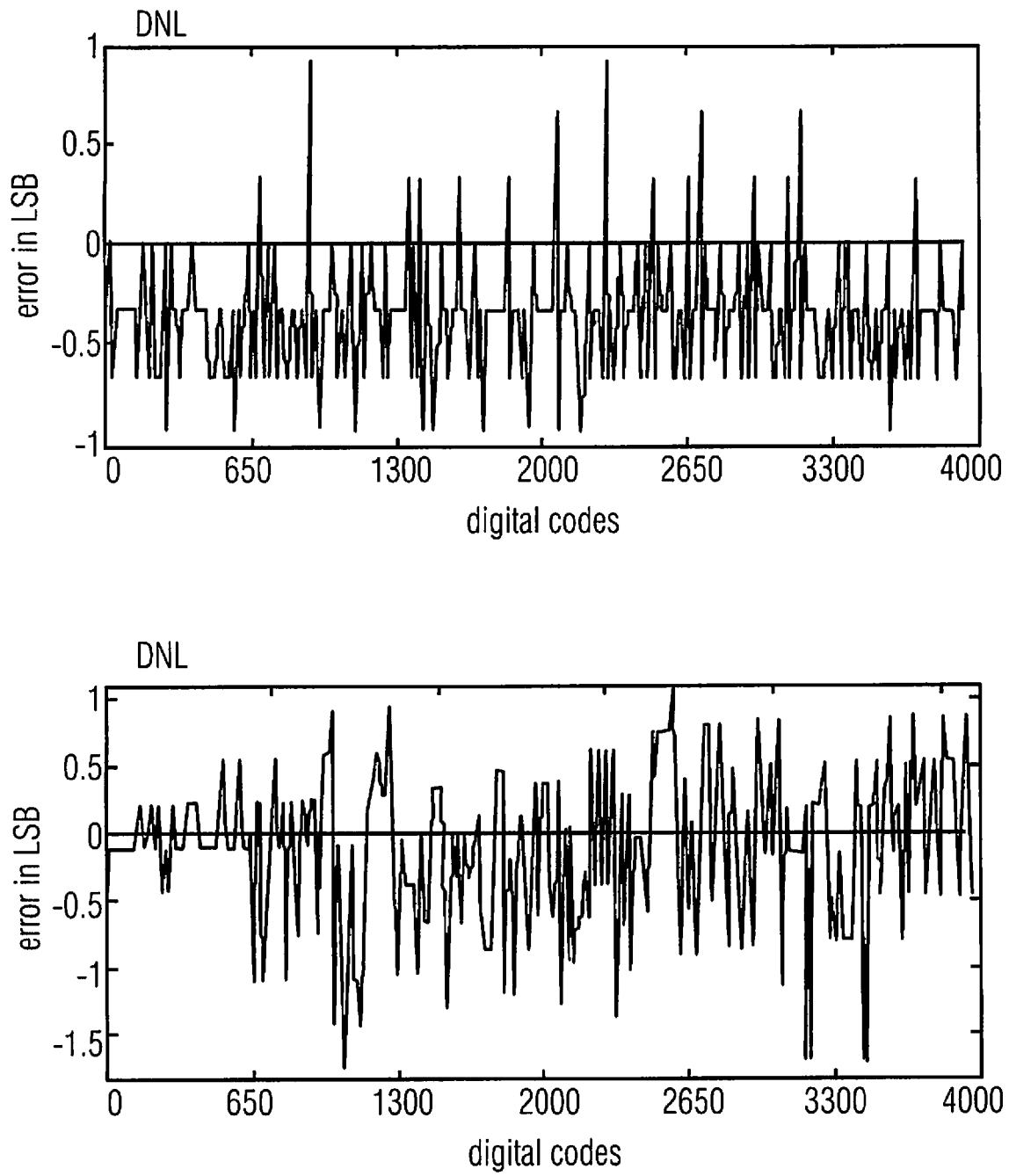
FIG. 6 shows non-linearity error rates of an embodiment.

FIG. 6 illustrates simulation results, the differential non-linearity (DNL) being depicted at the top of FIG. 6, and the integral non-linearity (INL) being depicted at the bottom of FIG. 6. For both simulations, a hybrid array having the above-described shield was set as a condition. Both diagrams of FIG. 6 show the errors in relation to LSB, i.e. measured at the least significant bit position, plotted over the number of digital codes simulated. It may be seen from the top of FIG. 6 that the DNL error is less than 0.8 LSB, and that the peak INL error amounts to less than about 1.8 LSB. The gain error and the offset error may both be considered to be insignificant, since they range from 0.1 to 0.2 LSB. For applications such as CMOS image sensors, for example, wherein static errors may be significant, utilization of an embodiment allows reducing the space requirement and the power consumption while enabling higher resolution.

So as to also investigate the dynamic properties of ADCs, dynamic tests using a sinusoidal signal of the frequency of 20 kHz to 2 MHz as the input signal were additionally performed on the embodiment. The signal-to-noise ratio (SNR) of the signal of the frequency of 20 kHz was calculated to be about 66 dB, and the signal-to-noise and distortion ratio (SINAD) was determined to be about 65 dB, which results in an effective bit number of 10.6 bits. A 2 MHz signal resulted in an effective number of bits (ENOB) of 10 bits, which was reduced by several dB. Depending on the requirements made by the respective applications, prolongation of the clock frequency may improve the effective number of bits and the performance of the ADC, since in this manner effects caused by the settling time of the voltage divider arrangement may be reduced.

FIG. 7 summarizes the simulation results in a tabular manner. The gain error, measured for the least significant bit (LSB), was 0.2. The offset error for the LSB was 0.1. Integral non-linearity was within a range of ±1.8, differential non-linearity within a range of ±0.8. The effective number of bits at 20 kHz was 10.6, and the signal-to-noise ratio was 66.9 dB. The signal-to-noise and distortion ratio at 20 kHz is 65.2 dB, the maximum power consumption was 630 µW.

Embodiments of the present invention have the advantage that they enable, while necessitating low power consumption, high resolution of an SAR ADC, which may be realized in 180 nm technology, for example. In addition, embodiments of the present invention offer the possibility that a converter which may combine binary weighted and C2C capacitor arrays, or capacitive voltage dividers, may be implemented in hybrid capacitive technology. Embodiments further provide the advantage of increased linearity of a capacitive voltage divider, which is achieved by means of the shielding concept in the C2C structure, the influence of the parasitic capacitances being reduced by a second voltage divider. As compared to conventional technology of SAR ADCs, embodiments may further provide improved linearity, reduced power consumption, and reduced space requirement. Moreover, embodiments of the present invention offer the possibility of providing an ADC or DAC that may be operated across a wide frequency range covering biomedical applications up to image processing and telecommunication.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A capacitive voltage divider arrangement comprising a first voltage divider and a second voltage divider, a first parasitic capacitance and a second parasitic capacitance being formed between the first capacitive voltage divider and the second capacitive voltage divider,
the first capacitive voltage divider comprising:
a terminal for a signal;
a first capacitance, via which the terminal is coupleable to a reference potential;
a second capacitance; and
a third capacitance that is coupleable to the reference potential, the second capacitance being coupled in between the terminal and the third capacitance; and
the second capacitive voltage divider comprising:
a first compensation capacitance, via which the terminal is coupleable to the reference potential, the first compensation capacitance further being coupled to the terminal via the first parasitic capacitance;
a second compensation capacitance; and
a third compensation capacitance that is coupleable to the reference potential, the second compensation capacitance being coupled in between the terminal and the third compensation capacitance, and the second parasitic capacitance coupling the third capacitance, at a terminal coupled to the second capacitance, to the third compensation capacitance, at a terminal coupled to the second compensation capacitance.

2. The capacitive voltage divider arrangement as claimed in claim 1, wherein the first capacitance, the second capacitance, the third capacitance, the first parasitic capacitance, the second parasitic capacitance, the first compensation capacitance, the second compensation capacitance, and the third compensation capacitance are implemented on a substrate.

3. The capacitive voltage divider arrangement as claimed in claim 2, wherein the substrate comprises a first layer wherein the first capacitance, the second capacitance, and the third capacitance are implemented, and the substrate comprises a second layer wherein the first compensation capacitance, the second compensation capacitance, and the third compensation capacitance are implemented, the first parasitic capacitance and the second parasitic capacitance forming between the first and second layers.

4. The capacitive voltage divider arrangement as claimed in claim 1, further comprising a third parasitic capacitance, via which the terminal is coupleable to the reference potential, and the capacitive voltage divider arrangement further comprising a fourth parasitic capacitance, via which the third compensation capacitance, at the terminal coupled to the second compensation capacitance is coupleable to the reference potential.

5. The capacitive voltage divider arrangement as claimed in claim 4, wherein the third parasitic capacitance and the fourth parasitic capacitance differ by less than 10%, 1%, or 0.1% in terms of their capacitances.

6. The capacitive voltage divider arrangement as claimed in claim 1, wherein the first capacitance and the second capacitance differ by less than 10%, 1%, or 0.1% in terms of their capacitances, and/or wherein the first compensation capacitance and the second compensation capacitance differ by less than 10%, 1%, or 0.1% in terms of their capacitances, and/or wherein half of the second capacitance and the third capacitance differ by less than 10%, 1%, or 0.1% in terms of their capacitances, and/or wherein half of the second compensation capacitance and the third compensation capacitance differ by less than 10%, 1%, or 0.1% in terms of their capacitances.

7. The capacitive voltage divider arrangement as claimed in claim 1, wherein the first parasitic capacitance and the second parasitic capacitance differ by less than 10%, 1%, or 0.1% in terms of their capacitances, and/or wherein the third parasitic capacitance and the fourth parasitic capacitance differ by less than 10%, 1%, or 0.1% in terms of their capacitances.

8. The capacitive voltage divider arrangement as claimed in claim 1, wherein the first voltage divider comprises a capacitive cascade connection comprising a plurality of capacitances, and wherein the second voltage divider comprises a capacitive cascade connection comprising a plurality of capacitances.

9. An analog-to-digital converter comprising a capacitive voltage divider arrangement, the capacitive voltage divider arrangement comprising a first voltage divider and a second voltage divider, a first parasitic capacitance and a second parasitic capacitance being formed between the first capacitive voltage divider and the second capacitive voltage divider,
the first capacitive voltage divider comprising:
a terminal for a signal;
a first capacitance, via which the terminal is coupleable to a reference potential;
a second capacitance; and
a third capacitance that is coupleable to the reference potential, the second capacitance being coupled in between the terminal and the third capacitance; and
the second capacitive voltage divider comprising:
a first compensation capacitance, via which the terminal is coupleable to the reference potential, the first compensation capacitance further being coupled to the terminal via the first parasitic capacitance;
a second compensation capacitance; and
a third compensation capacitance that is coupleable to the reference potential, the second compensation capacitance being coupled in between the terminal and the third compensation capacitance, and the second parasitic capacitance coupling the third capacitance, at a terminal coupled to the second capacitance, to the third compensation capacitance, at a terminal coupled to the second compensation capacitance.

10. The analog-to-digital converter as claimed in claim 9, configured to be operated in a successive-approximation method.

11. The analog-to-digital converter as claimed in claim 9, implemented in CMOS 2-poly 4-metal technology (CMOS=complementary metal oxide semiconductor).

12. A digital-to-analog converter comprising an analog-to-digital converter, the analog-to-digital converter comprising a capacitive voltage divider arrangement, the capacitive voltage divider arrangement comprising a first voltage divider and a second voltage divider, a first parasitic capacitance and a second parasitic capacitance being formed between the first capacitive voltage divider and the second capacitive voltage divider,
the first capacitive voltage divider comprising:
a terminal for a signal;
a first capacitance, via which the terminal is coupleable to a reference potential;
a second capacitance; and
a third capacitance that is coupleable to the reference potential, the second capacitance being coupled in between the terminal and the third capacitance; and
the second capacitive voltage divider comprising:
a first compensation capacitance, via which the terminal is coupleable to the reference potential, the first compensation capacitance further being coupled to the terminal via the first parasitic capacitance;
a second compensation capacitance; and
a third compensation capacitance that is coupleable to the reference potential, the second compensation capacitance being coupled in between the terminal and the third compensation capacitance, and the second parasitic capacitance coupling the third capacitance, at a terminal coupled to the second capacitance, to the third compensation capacitance, at a terminal coupled to the second compensation capacitance, further comprising a first switch matrix, a second switch matrix, an SAR control logic (SAR=successive-approximation register), a sample-and-hold element, and a comparator.

* * * * *